United States Patent [19]

Carl, Jr.

[11] Patent Number: 5,164,660
[45] Date of Patent: Nov. 17, 1992

[54] TRUE, POWER, RMS CURRENT, AND RMS VOLTAGE MEASURING DEVICES

[75] Inventor: Frederick G. Carl, Jr., Houston, Tex.

[73] Assignee: Shell Oil Company, Houston, Tex.

[21] Appl. No.: 743,646

[22] Filed: Aug. 12, 1991

[51] Int. Cl.[5] ............................................. G01R 31/00
[52] U.S. Cl. .................................... 324/132; 324/142; 324/103 R; 364/483
[58] Field of Search .................... 324/142, 127, 103 R, 324/123 R, 132; 364/483, 550; 328/160

[56] References Cited

U.S. PATENT DOCUMENTS

| | | | |
|---|---|---|---|
| 3,961,257 | 6/1976 | Milkovic | 324/142 |
| 4,055,804 | 10/1977 | Mayfield | 324/142 |
| 4,079,313 | 3/1978 | Callan | 324/142 |
| 4,570,715 | 2/1986 | Van Meurs et al. | 166/302 |
| 4,572,299 | 2/1986 | Van Egmond et al. | 166/385 |
| 4,616,705 | 10/1986 | Stegemeier et al. | 166/250 |
| 4,704,514 | 11/1987 | Van Egmond et al. | 219/278 |

Primary Examiner—Vinh Nguyen
Attorney, Agent, or Firm—Del S. Christensen

[57] ABSTRACT

Methods and apparatuses to measure RMS current, RMS voltage, and true power for zero-fired alternating current loads are provided. These methods and apparatuses are simple and inexpensive and provide updated measurements after each set of blocked or unblocked alternating current cycles.

2 Claims, 2 Drawing Sheets

TRUE, POWER, RMS CURRENT, AND RMS VOLTAGE MEASURING DEVICES

FIELD OF THE INVENTION

This invention relates to measurement of electrical power, root mean square ("RMS") current, and RMS voltage for zero-fired power loads.

BACKGROUND OF THE INVENTION

Zero-fired controls are often used to control alternating current to electrical resistance-type heaters. Zero firing applies complete cycles of alternating current, and then blocks complete cycles. Typically, cycles are passed and blocked within one-second time intervals. For example, 40 cycles will be passed and then 20 blocked for 60 Hz service. Zero firing allows the voltage to be blocked and opened as the voltage passes through zero. This avoids opening power at non-zero values, and the resultant spikes in current. These current spikes cause deterioration of heater electrical insulating materials.

A common alternative to zero firing is phase-angle firing. Phase-angle firing applies a portion of each cycle of alternating voltage. Typically, voltage is opened at non-zero values and blocked when the cycle reaches zero.

Devices are available for measuring RMS current, RMS voltage, and true power for phase-angle firing power controls. But these devices are not accurate when full cycles of alternating voltage are passed and blocked. This type of instrumentation would be valuable for trouble-shooting, monitoring and control of electrical equipment and power supplies. Such simple equipment is not available for zero-firing power controls.

Prior art instrumentation to measure RMS current, RMS voltage, or true power for zero-fired applications either have a significant lag time between changes in the measured variable and the indication of the change, or are relatively expensive. Accurately measuring RMS current, RMS voltage, or true power with a measurement that is updated as often as every set of blocked and non-blocked power cycles currently requires computer digitization of the process signals. This requires relatively expensive equipment. It would be advantageous to measure these zero-fired process variables with an apparatus which updates the measurements as frequently as once each cycle of blocked and unblocked alternating current cycles, and which does not require computer digitization of the process signals.

It is therefore an object of the present invention to provide methods and apparatuses capable of measuring true power, RMS voltage, and RMS current for zero-fired electrical power controls. It is a further object to provide such methods and apparatuses which can update the measurement signal as often as each set of blocked and non-blocked alternating current cycles. It is also an object of the present invention to provide such methods and apparatuses in which the process signals are digitized by an inexpensive, dedicated circuit.

SUMMARY OF THE INVENTION

These and other objects are accomplished by the following methods and apparatuses.

The method of measuring RMS current for alternating current zero-fired power loads comprises the steps of:

generating the instantaneous current to provide an instantaneous current signal;

rectifying the instantaneous current signal;

squaring the rectified instantaneous current signal;

modulating the squared rectified instantaneous current signal, resulting in a signal which comprises pulses, the frequency of the pulses being proportional to the squared rectified instantaneous current signal; and counting the pulses of modulated squared rectified instantaneous measurement signal over a time period which includes at least one set of unblocked and at least one set of blocked alternating current cycles to generate a signal which is proportional to the square of the root mean square current.

The method of the present invention to measure RMS voltage for alternating current zero-fired power loads comprises the steps of:

producing the instantaneous voltage to provide an instantaneous voltage signal;

rectifying the instantaneous voltage signal;

squaring the rectified instantaneous voltage signal;

modulating the squared rectified instantaneous voltage signal, resulting in a signal which comprises pulses, the frequency of the pulses being proportional to the squared rectified instantaneous voltage signal; and counting the pulses of modulated squared rectified instantaneous voltage signal over a time period which includes at least one set of unblocked and at least one set of blocked alternating current cycles to generate a signal which is proportional to the square of the root mean square voltage.

The method of the present invention to measure true power for alternating current zero-fired power loads comprises the steps of:

generating an instantaneous current signal;

providing an instantaneous voltage signal;

multiplying the instantaneous voltage signal by the instantaneous current signal to produce an instantaneous power signal;

modulating the instantaneous power signal to produce a signal of pulses which have a frequency which varies proportionally with the instantaneous power signal; and counting the pulses over a time period which includes at least one set of blocked alternating current cycles and at least one unblocked set wherein the counting subtracts pulses during periods when the instantaneous power is negative to generate a signal which is proportional to the true power over the time period.

The apparatus to measure RMS current in alternating current zero fired loads comprises:

a) a precision rectifier which rectifies an instantaneous current signal;

b) a squarer which squares the rectified instantaneous current signal;

c) a voltage-to-frequency converter which modulates the squared rectified instantaneous current signal to a signal of pulses wherein the frequency of the pulses is proportional to the squared rectified current signal;

d) a counter which generates a digital signal which is equal to the number of pulses in the signal from the voltage-to-frequency converter wherein the counter is reset periodically; and e) a digital-to-analog converter that converts the count to an analog voltage; and f) a square root converter to generate a signal which is proportional to the square root of the signal which is proportional to the number of pulses, this signal being proportional to the RMS current.

The apparatus to measure true power comprises:

a) a multiplier which multiplies an instantaneous current signal by an instantaneous voltage signal to produce an instantaneous power signal;

b) a voltage-to-frequency converter which modulates the instantaneous power signal to a signal of pulses wherein the pulses are of a frequency which is proportional to the value of the instantaneous power signal; and c) a counter which counts the pulses of the modulated instantaneous power signal, generating digital signal which is equal to the true power utilized by the power load wherein the counter subtracts pulses when the instantaneous power is negative, and the counter is periodically reset; and d) a digital-to-analog converter that can convert the digital signal to an analog signal which is proportional to the true power.

The apparatus to measure RMS voltage in alternating current zero fired power loads comprising:

a) a precision rectifier which rectifies an instantaneous voltage signal;

b) a squarer which squares the rectified instantaneous voltage signal;

c) a voltage-to-frequency converter which modulates the squared rectified instantaneous voltage signal to a signal of pulses wherein the frequency of the pulses is proportional to the squared rectified voltage signal;

d) a counter which generates a digital signal which is equal to the number of pulses in the signal from the voltage-to-frequency converter wherein the counter is reset periodically;

e) a digital-to-analog converter which converts the digital signal to an analot signal; and f) a square root converter to generate a signal which is proportional to the square root of the analog signal, this signal being proportional to the RMS voltage.

Measurement of RMS voltage, RMS current, and true power for a zero-fired alternating current power supply with a simple circuit which can update the measurement signal after each set of blocked and unblocked power cycles was not before possible. The use of the frequency modulator to enable integration of the instantaneous signals along with resetting of the counter as often as each set of blocked and unblocked cycles of power results in this simple and rapid responding measurement apparatuses and methods.

DETAILED DESCRIPTION OF THE INVENTION

Zero firing of an electrical load applies a number of complete cycles of alternating current each time period and blocks the remaining complete cycles of that time period. A convenient and typically utilized time period is one second. Zero firing both blocks and opens the power to the heater as the instantaneous voltage passes through zero. Zero firing is preferred over other types of firing because opening power at non-zero voltages results in undesirable current spikes. These current spikes cause deterioration of heater electrical insulating materials. Electrical resistance heaters often utilize zero-firing power control.

Figure 1:
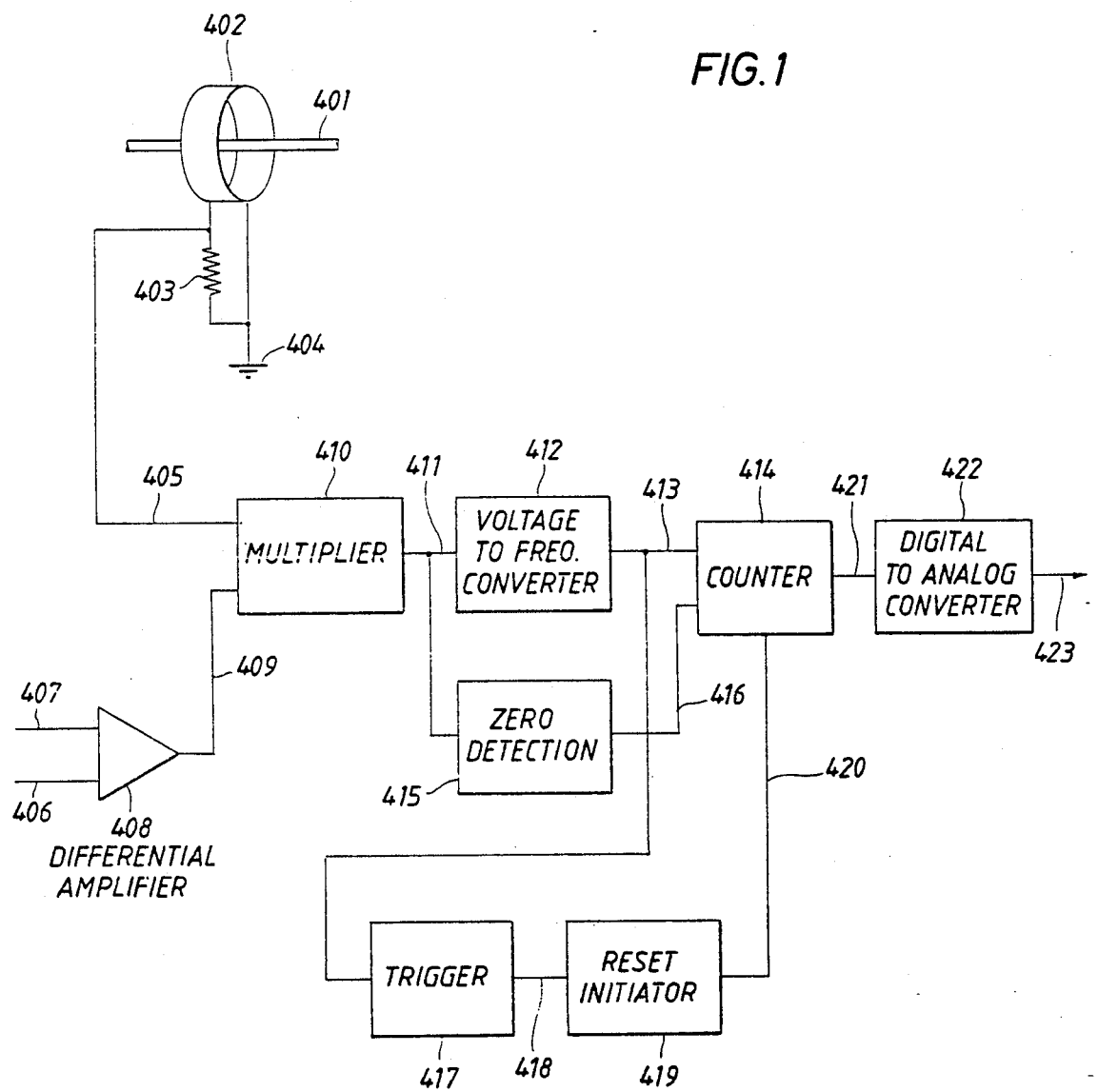
FIG. 1 is a schematic diagram of the true power measurement circuit.
Figure 2:
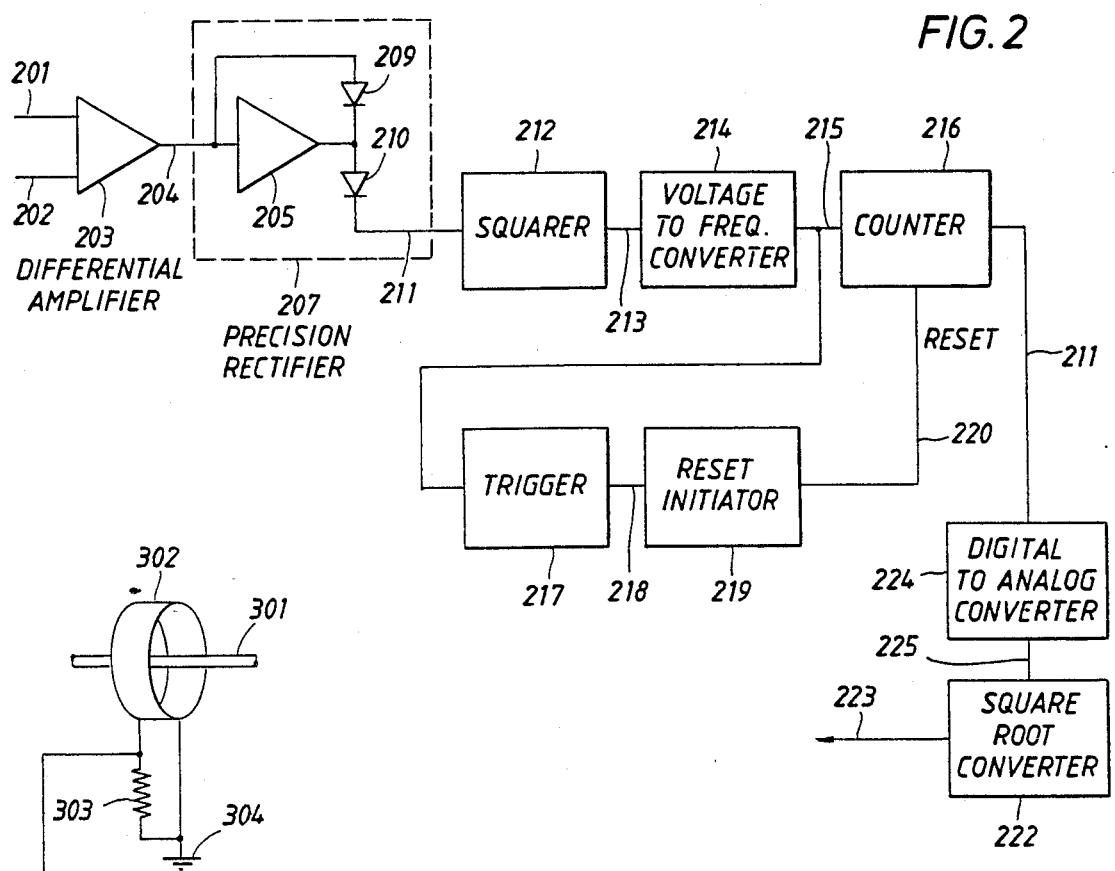
FIG. 2 is a schematic diagram of the RMS voltage measurement circuit.
Figure 3:
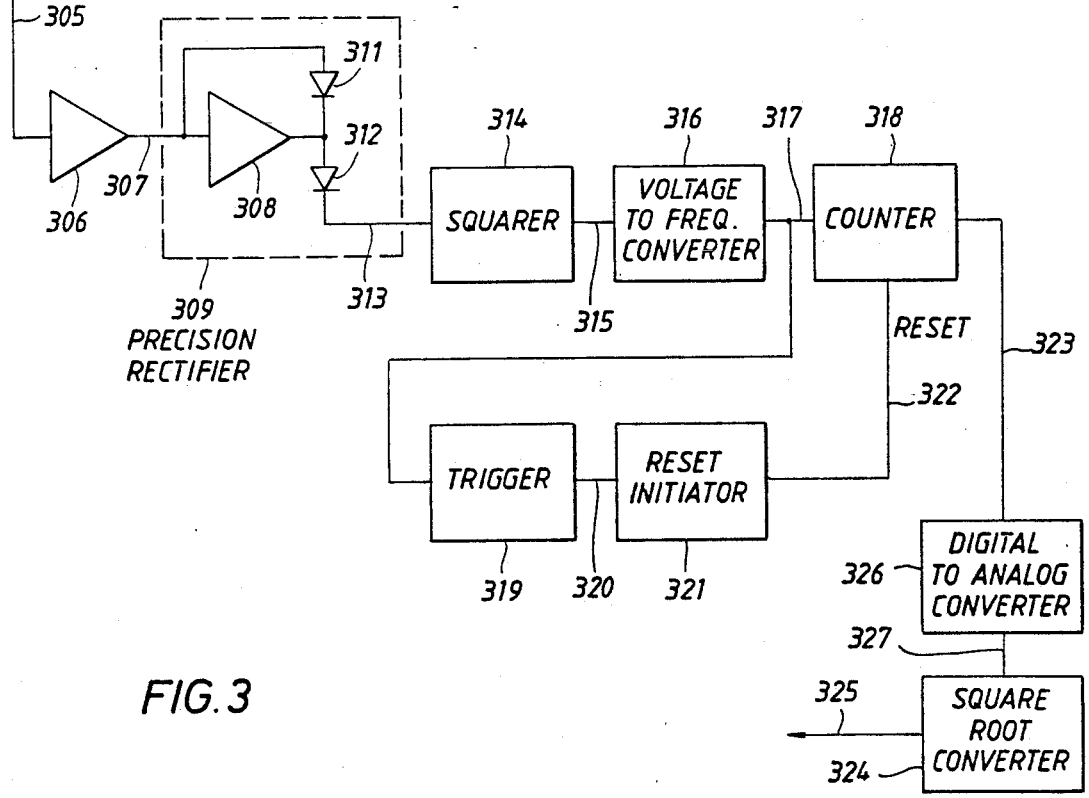
FIG. 3 is a schematic diagram of the RMS current measurement circuit.

When zero firing is utilized, the power supply can be controlled on voltage control by commercially available controllers, such as a Loyola 480/960 VAC 1 phase, 3-wire, 288 KVA full wave power controller. RMS voltage, RMS current, and true power are preferably measured by instrumentation which updates the measured values about once a second, or once every block of unblocked alternating current cycles. Such instrumentation is not commercially available. Schematics of circuitry for measuring RMS voltage, RMS current, and true power are shown in FIGS. 1 through 3, respectively. These circuits provide measured values which are updated every set of unblocked power cycles. Precise and rapid measurement of variables for zero-fired power loads is therefore provided.

Referring to FIG. 2, the RMS voltage is measured based on voltage samples 201 and 202, which can be from the leads to a power load. The system shown measures voltage for single-phase power. The samples 201 and 202, are inputs to a differential amplifier, 203, which produces a signal which is equal to the difference between the two samples to produce one instantaneous differential voltage signal, 204. The differential voltage signal will vary about zero as a sine wave. The portions of this sine wave which are negative values are inverted by a precision rectifier, 207. The precision rectifier comprises an inverter, 205, and diodes 209 and 210, which permit the positive charges to pass through to the rectified signal, 211. The rectified signal is then squared by the squarer, 212, to obtain a signal, 213, which is proportional to the square of the differential voltage. An acceptable device to perform this squaring is an Analog Device AD533LD, IC. The conversion of the instantaneous voltage to an integrated voltage is accomplished by first converting the instantaneous voltage to a modulated signal of identical amplitude peaks which vary in frequency with the amplitude of the complex wave input. This is accomplished by a voltage-to-frequency converter, 214. An acceptable voltage-to-frequency converter is an Analog Device AD537KD. This converter produces pulses which vary within a zero to 10 KHZ bandwidth. The frequency varies proportionally with the amplitude of the squared differential voltage, 213. Because the number of pulses in a small time period in signal 215 is proportional to the square of voltage times the length of time, the number of pulses can be summed to provide a digital signal which is proportional to the RMS voltage squared times the length of the time period. A counter, 216, counts the pulses in signal 215 and provides such a signal, 221. The acceptable counter may be assembled utilizing four CD4416BE, ICs. The counter is reset each second by a trigger, 217, and reset initiator, 219.

Of course, different time intervals could be utilized, but one-second intervals are convenient. The trigger utilizes the voltage-to-frequency converter output signal, 215, and sends a signal, 218, to the reset initiator, 219, when pulses are no longer detected. This signal goes to zero when the pulses stop. The reset initiator, 219, detects the drop in the signal from the trigger, 218, and sends a pulse signal, 220, when this drop is detected. The pulse signal from the reset initiator latches the present count then resets the counter, 216. The output signal of the counter, 221, is therefore updated each second, with the previous value held in latches until it is updated. The output from the counter, 221, goes to a digital-to-analog converter, 224. The digital-to-analog converter, 224, converts the digital signal to an analog signal, 225. The analog signal, 225, then goes to a square root converter, 222. The output, 223, of the square root converter, 222, is a signal which is proportional to the true RMS voltage measured between the samples 201 and 202.

Other methods for resetting the time period for counting the pulses can also be utilized. The length of the time period could be independently determined as a multiple of the time required for one set of blocked plus one set of unblocked alternating power cycles. The counter could then be reset either in coordination with the blocking and unblocking, or independently of the blocking and unblocking. If the time period varies, it is preferable to include a step of dividing the number of counted pulses by a signal which is proportional to the length of the time periods.

FIG. 3 is a schematic of the current measurement device preferred when the power load is powered by zero firing. Referring to FIG. 3, a signal proportional to the instantaneous current, 305, is generated by a transformer, 302, which surrounds a power supply cable, 301. A 200:5 torroidal transformer is acceptable. With single-phase firing, and two legs of cables, the current going to one leg is measured. The transformer's output is dropped across a resistor, 303, to a common ground, 304. A 0.4 ohm resistor is preferred. This provides an instantaneous signal, 305, having an acceptable signal-to-noise ratio. The current signal, 305, preferably goes to a high impedance device, 306, such as an FET amplifier. This buffers the input signal from the loading effects of the measurement circuitry. The high impedance device produces an output, 307, which is general to the amplitude of the input signal, 305. The output of the high impedance device, 307, is then rectified by a precision rectifier, 309. The precision rectifier can comprise an inverter, 308, and diodes, 311 and 312, to produce a signal, 313, equal to the absolute value of the high impedance device output, 307. The rectified signal is then squared by the squarer, 314, to provide a signal, 315, which is proportional to the square of the instantaneous current signal. The squared signal is then modulated by a voltage-to-frequency converter, 316, as in the RMS voltage measurement. The voltage-to-frequency converter produces a stream of pulses, 317, of constant amplitude at a frequency which varies proportionally with the amplitude of the squared, rectified current signal, 315. The number of pulses in the stream of pulses are then counted by the counter, 318, to arrive at an integration of the squared, rectified current measurement, 323. As with the RMS voltage measurement circuitry described above, the counter, 318, is reset by a trigger, 319, and a reset initiator, 321. The trigger, 319, generates a signal when pulses are detected within the stream of pulses. When the pulses stop, the signal from the trigger, 320, drops to a zero value. The reset initiator, 321, generates a pulse in the reset signal, 322, when the drop in the signal from the trigger, 320, is detected. The reset signal, 322, will reset the counter, 318. The integrated, squared, rectified current signal, 323, is then processed by a digital-to-analog converter, 326, square root converter, 324, which generates a signal, 325, which is equal to the square root of the integrated, squared, rectified current signal, 323. This square root signal is proportional to the RMS current, and is updated each second by this circuit when the alternating current cycles are blocked and unblocked within one-second time intervals.

The components of the RMS voltage measurement circuit described above are also acceptable for use in the RMS current measurement circuit.

The true power is also measured by a circuit which also incorporates a voltage-to-frequency converter and a counter to integrate the power over a one-second time frame.

FIG. 1 is a schematic of the true power measurement device preferred when the heater is powered by zero firing. Referring to FIG. 1, an instantaneous current signal, 405, is generated as it is generated for the RMS current measurement. The current signal is generated by a transformer, 402, which surrounds a power supply cable, 401. A 200:5 torroidal transformer is acceptable. The transformer's output is dropped across a resistor, 403, to a common ground, 404, to provide a noise-free instantaneous amperage signal, 405. A differential voltage signal, 409 is provided by a differential amplifier, 408, which subtracts voltage samples from the supply cables, 406 and 407. The differential voltage signal, 409, is proportional to the difference between the voltage samples 406 and 407. The differential voltage signal, 409, is then multiplied by the instantaneous amperage signal, 405, by a multiplier, 410, to provide an instantaneous power signal, 411. An acceptable multiplier device is an Analog Devices AD533LD multiplier. The instantaeous power signal is then integrated like the RMS current and voltage signals are integrated as described above. The instantaneous power signal is integrated by first modulating the signal to a signal of pulses which vary in frequency with the value of the instantaneous power signal, 413, using a voltage-to-frequency converter, 412. The current and voltage may, over a portion of the cycle, be out of phase. This results in a negative instantaneous power. A zero detection chip, 415, may be necessary to recognize that the instantaneous power, 411, is negative, and cause the counter, 414, to subtract pulses over the time period rather than add pulses. A signal, 416, from the zero detection chip, 415, can trigger the counter, 414, to subtract pulses. The counter can be reset by a trigger, 417, and a reset initiator, 419. The trigger, 417, generates a positive signal when pulses are being generated by the voltage-to-frequency converter 412. The signal generated by the trigger, 418, is routed to the reset initiator, 419, which generates a pulse when the signal from the trigger drops. The reset initiator, 419, generates this pulse in a signal to the counter, 420, which causes the counter to reset. The counter generates a signal, 421, which is updated each time period to a value proportional to the count of pulses counted in the last second. This signal is processed by a digital-to-analog converter, 422, generating an output, 423, which is proportional to the true power measured over the time period. A one-second time period is preferred. Acceptable chips for the voltage-to-frequency converter and counters are those described above as useful in the RMS measurement voltage circuit.

The foregoing description of the invention is merely intended to be explanatory thereof, and various changes in the details of the described method and apparatus may be made within the scope of the appended claims without departing from the spirit of the invention.

I claim:

1. An apparatus to measure true power in alternating current zero-fired power loads wherein sets of cycles of alternating current are alternately blocked and passed, the apparatus comprising:
   a) a multiplier which multiplies an instantaneous current signal by an instantaneous voltage signal to produce an instantaneous power signal;
   b) a voltage-to-frequency converter which modulates the instantaneous power signal to a signal of pulses wherein the pulses are of a frequency which is proportional to the value of the instantaneous power signal;
   c) a reset initiator that detects the cessation of pulses at the end of each set of unblocked alternating current cycles and sends a pulse signal when the end of the set of unblocked alternating current cycles is detected;
   d) a counter which counts the pulses of the modulated instantaneous power signal, starting with one pulse signal from the reset initiator and ending with the next pulse signal from the reset initiator and thereby generating a digital signal which is equal to the true power utilized by the power load wherein the counter subtracts pulses when the instantaneous power is negative; and
   e) a digital-to-analog converter that can convert the digital signal to an analog signal which is proportional to true power utilized by the power load over the time period.

2. A method to determine true power for alternating current zero-fired power loads wherein sets of cycles of alternating current are alternately blocked and passed, the method comprising steps of:
   generating an instantaneous current signal;
   providing an instantaneous voltage signal;
   multiplying the instantaneous voltage signal be the instantaneous current signal to produce an instantaneous power signal;
   modulating the instantaneous power signal to produce a signal of pulses which have a frequency which varies proportionally with the instantaneous power signal;
   detecting the cessation of pulses at the end of each set of unblocked alternating current cycles;
   generating a pulse signal when the end of each set of unblocked alternating current cycles is detected; and
   counting the pulses over a time period starting with one pulse signal and ending with the next pulse signal wherein the counting subtracts pulses during period when instantaneous power is negative to generate a signal which is proportional to the true power over the time period.

* * * * *